United States Patent
Hemphill et al.

(10) Patent No.: US 7,100,101 B1
(45) Date of Patent: Aug. 29, 2006

(54) METHOD AND APPARATUS FOR CONCATENATED AND INTERLEAVED TURBO PRODUCT CODE ENCODING AND DECODING

(75) Inventors: Edwin J. Hemphill, Kaysville, UT (US); James M. Simkins, Park City, UT (US); Raied N. Mazahreh, Salt Lake City, UT (US)

(73) Assignee: Xilinx, Inc., San Jose, CA (US)

( * ) Notice: Subject to any disclaimer, the term of this patent is extended or adjusted under 35 U.S.C. 154(b) by 523 days.

(21) Appl. No.: 10/291,441

(22) Filed: Nov. 8, 2002

(51) Int. Cl.
  *H03M 13/27* (2006.01)
  *H03M 13/29* (2006.01)
  *H03M 13/39* (2006.01)
  *H03M 13/45* (2006.01)

(52) U.S. Cl. .................. 714/755; 714/780
(58) Field of Classification Search ............ 714/755, 714/780
  See application file for complete search history.

(56) References Cited

U.S. PATENT DOCUMENTS

| | | | | |
|---|---|---|---|---|
| 4,627,058 A | * | 12/1986 | Moriyama | 714/758 |
| 4,630,272 A | * | 12/1986 | Fukami et al. | 714/755 |
| 4,719,628 A | * | 1/1988 | Ozaki et al. | 714/755 |
| 5,761,248 A | * | 6/1998 | Hagenauer et al. | 375/340 |
| 5,966,359 A | * | 10/1999 | Sako et al. | 369/59.14 |
| 6,065,147 A | * | 5/2000 | Pyndiah et al. | 714/755 |
| 6,161,209 A | * | 12/2000 | Moher | 714/780 |
| 6,233,709 B1 | * | 5/2001 | Zhang et al. | 714/774 |
| 6,272,183 B1 | * | 8/2001 | Berens et al. | 375/262 |
| 6,421,804 B1 | * | 7/2002 | Lee | 714/755 |
| 6,499,128 B1 | * | 12/2002 | Gerlach et al. | 714/755 |
| 6,526,538 B1 | * | 2/2003 | Hewitt | 714/780 |
| 6,571,369 B1 | * | 5/2003 | Li | 714/792 |
| 6,581,178 B1 | * | 6/2003 | Kondo | 714/758 |
| 6,845,481 B1 | * | 1/2005 | Gueguen et al. | 714/755 |

OTHER PUBLICATIONS

Burr, A.; Turbo-Codes: The Ultimate Error Control Codes?, May 10, 2001, pp. 155-165, available from IEE Electronics & Communication Engineering Journal, IEEE, 3 Park Avenue, 17th Floor, New York, NY 10016-5997.

Berrou, Claude et al., Near Shannon Limit Error—Correcting Coding and Decoding: Turbo-Codes (1), Feb. 1993, pp. 1064-1070, available from IEEE, 3 Park Avenue, 17th Floor, New York, NY 10016-5997.

* cited by examiner

*Primary Examiner*—Stephen M. Baker
(74) *Attorney, Agent, or Firm*—W. Eric Webostad; Edel M. Young

(57) ABSTRACT

Method and apparatus for concatenated and interleaved turbo product code (TPC) encoding and decoding are described. Described are series concatenated and interleaved TPC encoders and decoders. One or more combinations of these encoders and decoders may be combined to provide a coder/decoder (CODEC). Such a CODEC may be used for communicating information between a computer and a network via a data channel.

20 Claims, 14 Drawing Sheets

METHOD AND APPARATUS FOR CONCATENATED AND INTERLEAVED TURBO PRODUCT CODE ENCODING AND DECODING

FIELD OF THE INVENTION

One or more aspects of the present invention relate generally to at least one of turbo product code encoding and decoding, and more particularly to concatenated and interleaved turbo product code encoding and decoding.

BACKGROUND OF THE INVENTION

Conventionally, in design of communications systems there is a trade off between bit error rate (BER) and transmission bit rate. Higher bit rates tend to have higher BERs. A well-known limit on capacity of a communications channel is known as the Shannon Limit. In practice, where forward error correction (FEC) is used, the Shannon Limit is a theoretical boundary on channel capacity for a given modulation and code rate, where the code rate is the ratio of data bits to total bits transmitted for some amount of time, such as a second. FEC coding adds redundancy to a message by encoding such a message prior to transmission.

Error correction codes, including one or more used in FEC, classically exist as block codes (Hamming, Bose-Chaudhuri-Hochquenghem (BCH), and Reed-Solomon), convolutional codes (Viterbi), trellis codes, concatenated (Viterbi/Reed-Solomon), turbo convolutional codes (TCCs) and turbo product codes (TPCs). With respect to TPCs, an extended Hamming code (a Hamming code with a parity bit) and parity codes are commonly used to construct product codes.

Others have suggested serial concatenated TCC encoding, then interleaving output from that first TCC encoding followed by TCC encoding again the interleaved output. Others have suggested that such serial concatenated TCC encoding is not bandwidth efficient and exhibits an undesirable error floor phenomenon. However, with respect to TPCs, it should be understood that they are based on block codes and not convolutional codes.

Enhanced TPCs (eTPCs) add another dimension or error correction by encoding along diagonals of a TPC matrix, namely, after encoding rows and columns. Conventionally, encoding along the diagonals has been done with a simple parity code. So, for example, in eTPC simple parity coding is done on post-interleaved rows.

Accordingly, it would be both desirable and useful to provide FEC having more powerful encoding than conventional eTPC to improve BER.

SUMMARY OF THE INVENTION

One or more aspects in accordance with the present invention provide a concatenated TPC encoder, and one or more other aspects in accordance with the present invention provide a concatenated TPC decoder for decoding encoded information. One or more combinations of these separate aspects may be combined to provide a coder/decoder (CODEC), and such a CODEC may be part of a communication subsystem.

An aspect is an encoder for concatenated-interleaved turbo product code encoding having a first stage turbo product code encoder; an interleaver coupled to receive output from the first stage turbo product code encoder; and a second stage turbo product code encoder coupled to receive output from the interleaver.

Another aspect is an encoder for concatenated-interleaved turbo product code encoding having: at least one buffer disposed to receive input information; a turbo product code encoder coupled to the at least one buffer to receive buffered input information and configured to generate a first encoded output responsive to the buffered input information; an interleaver coupled to the turbo product code encoder to receive the first encoded output therefrom and coupled to the at least one buffer to provide interleaved output thereto; and the turbo product code encoder coupled to the at least one buffer to receive buffered interleaved output and configured to generate second encoded output responsive to the buffered interleaved output.

Another aspect is a method of concatenated interleaved turbo product code encoding with steps of: obtaining information; first turbo product code encoding the information obtained to provided encoded information; interleaving the encoded information to provide interleaved-encoded information; and second turbo product code encoding the interleaved-encoded information.

Another aspect is a method of decoding with steps of: first turbo product code decoding of a turbo product code block input having data bits and check bits to provide a first decoded code block; separating the first decoded code block into the data bits and the check bits; de-interleaving the data bits to provide de-interleaved data bits; second turbo product code decoding of the de-interleaved data bits to provide a portion of a second decoded code block; and combining the portion of the second decoded code block and the check bits stored to provide the second decoded code block.

Another aspect is a decoder for concatenated interleaved turbo product code decoding having: a first stage turbo product code decoder; a parser coupled to the first stage turbo product code decoder and configured to parse first stage turbo product code decoder output into data bits and check bits; a storage device coupled to receive and configured to store the check bits; a de-interleaver coupled to receive and configured to de-interleave the data bits; a second stage turbo product code decoder coupled to receive and to decode the data bits de-interleaved; an interleaver coupled to the second stage turbo product code decoder and configured to interleave second stage turbo product code decoder output into interleaved data bits; and an assembler coupled to receive the interleaved data bits and the check bits stored and configured to concatenate the interleaved data bits and the check bits.

Another aspect is a decoder for concatenated interleaved turbo product code decoding having: a first storage device configure to receive input information; a turbo product code decoder coupled to the first storage device and configure to obtain and decode the input information stored; a parser coupled to the first stage turbo product code decoder and configured to parse first stage turbo product code decoder output into data bits and check bits; a second storage device coupled to receive and configured to store the check bits; a de-interleaver coupled to receive and configured to de-interleave the data bits; the first storage device coupled to receive the data bits de-interleaved; the turbo product code decoder coupled to the first storage device and configured to obtain and decode the data bits de-interleaved; an interleaver coupled to the turbo product code decoder to receive the data bits de-interleaved and decoded and configure to provide interleaved data bits therefrom; and an assembler coupled to receive the interleaved data bits and the check bits stored and configured to concatenate the interleaved data bits and the check bits.

BRIEF DESCRIPTION OF THE DRAWINGS

Accompanying drawing(s) show exemplary embodiment(s) in accordance with one or more aspects of the present invention; however, the accompanying drawing(s) should not be taken to limit the present invention to the embodiment(s) shown, but are for explanation and understanding only.

DETAILED DESCRIPTION OF THE DRAWINGS

Figure 1A:
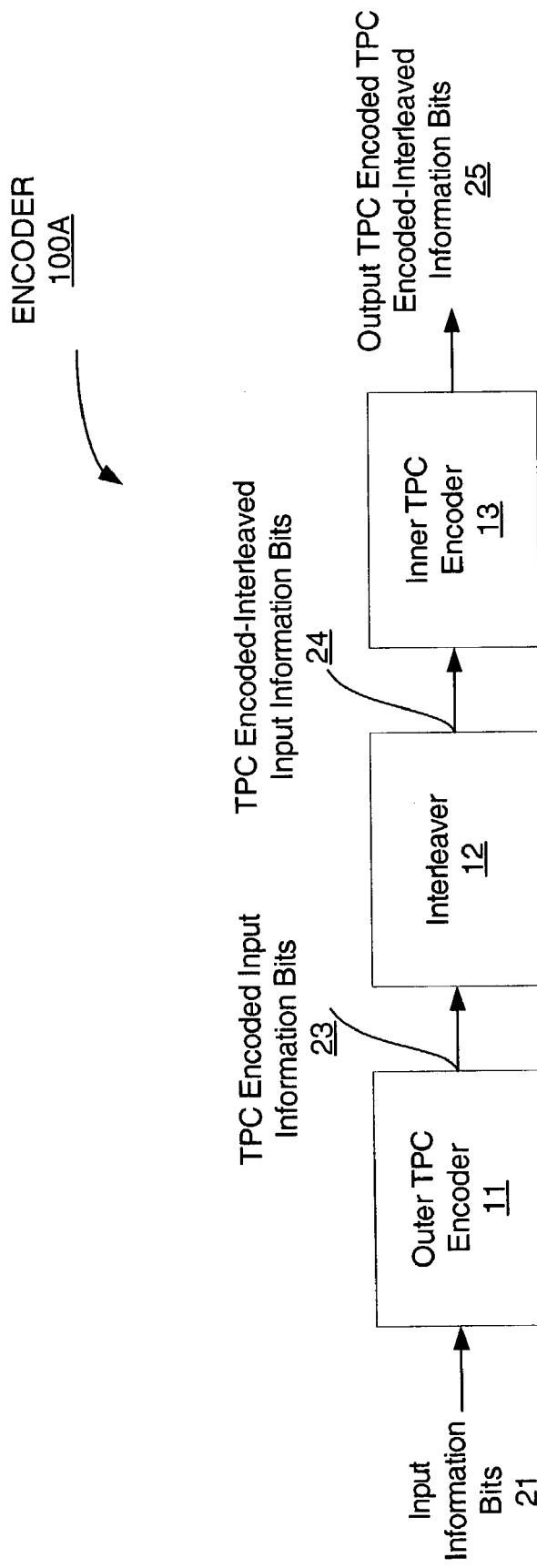
FIGS. 1A, 1B and 1C are high level block diagrams of exemplary embodiments of concatenated interleaved TPC encoders in accordance with one or more aspects of the present invention.
Figure 1B:
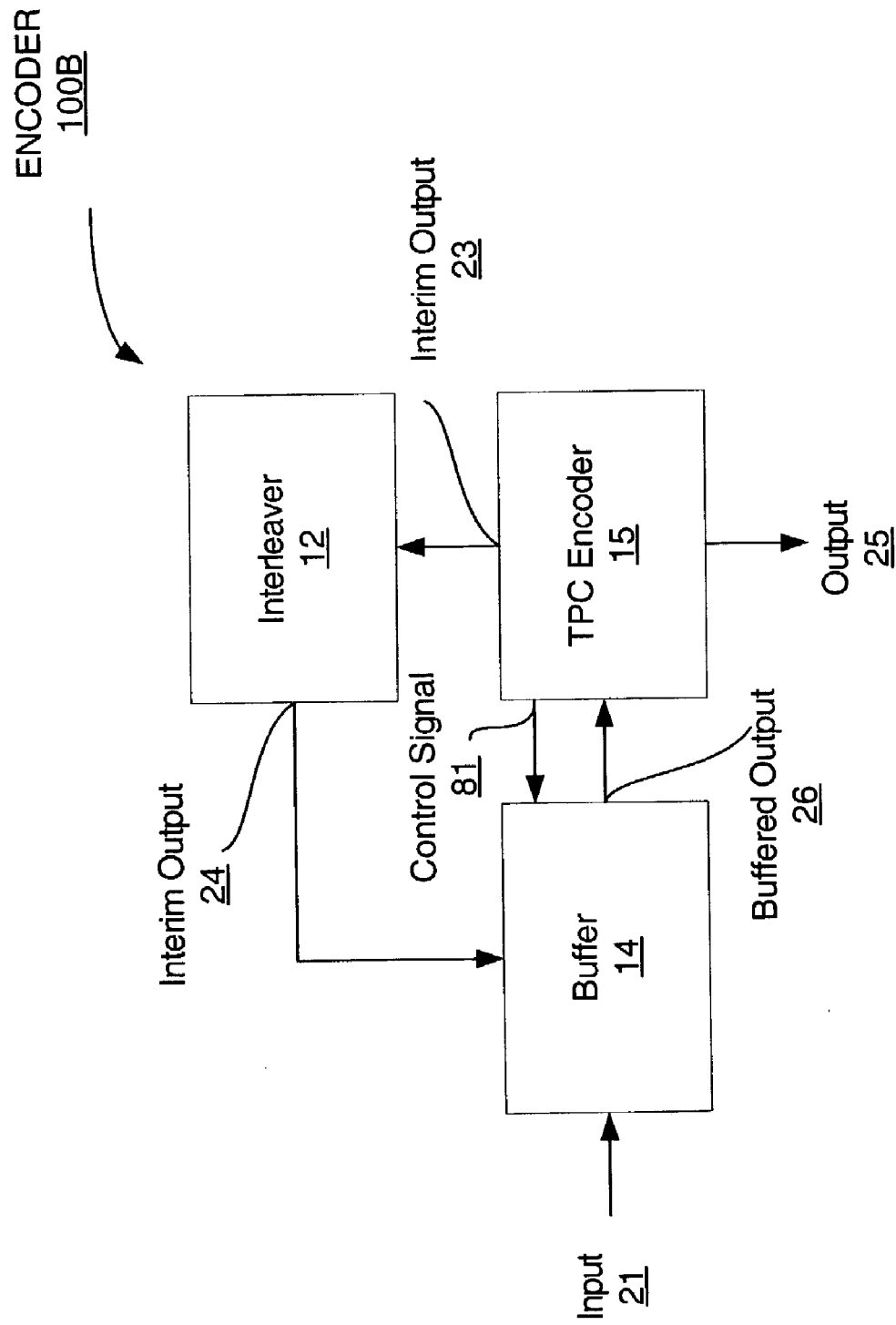
Figure 1C:
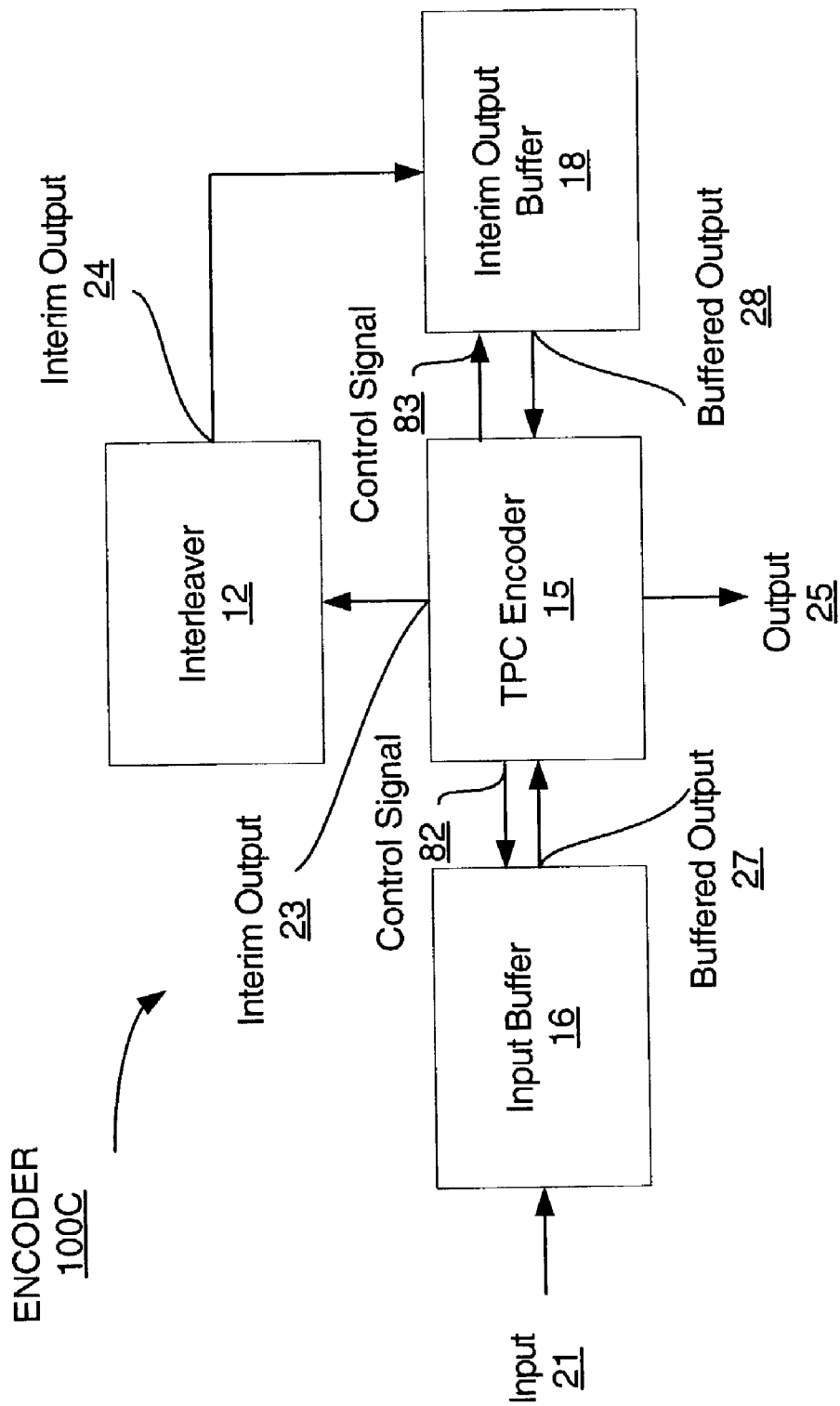

FIGS. 1A, 1B and 1C are high level block diagrams of respective exemplary embodiments of concatenated interleaved turbo product code (TPC) encoders in accordance with one or more aspects of the present invention. Encoders 100A, 100B and 100C are for concatenated interleaved TPC encoding. Input information bits, such as data bits, 21 are provided to outer TPC encoder 11 of encoder 100A. TPC, as described herein, is for algorithms or constituent codes for either parity codes or extended Hamming codes. However, other block codes may also be used as constituent codes.

Figure 2:
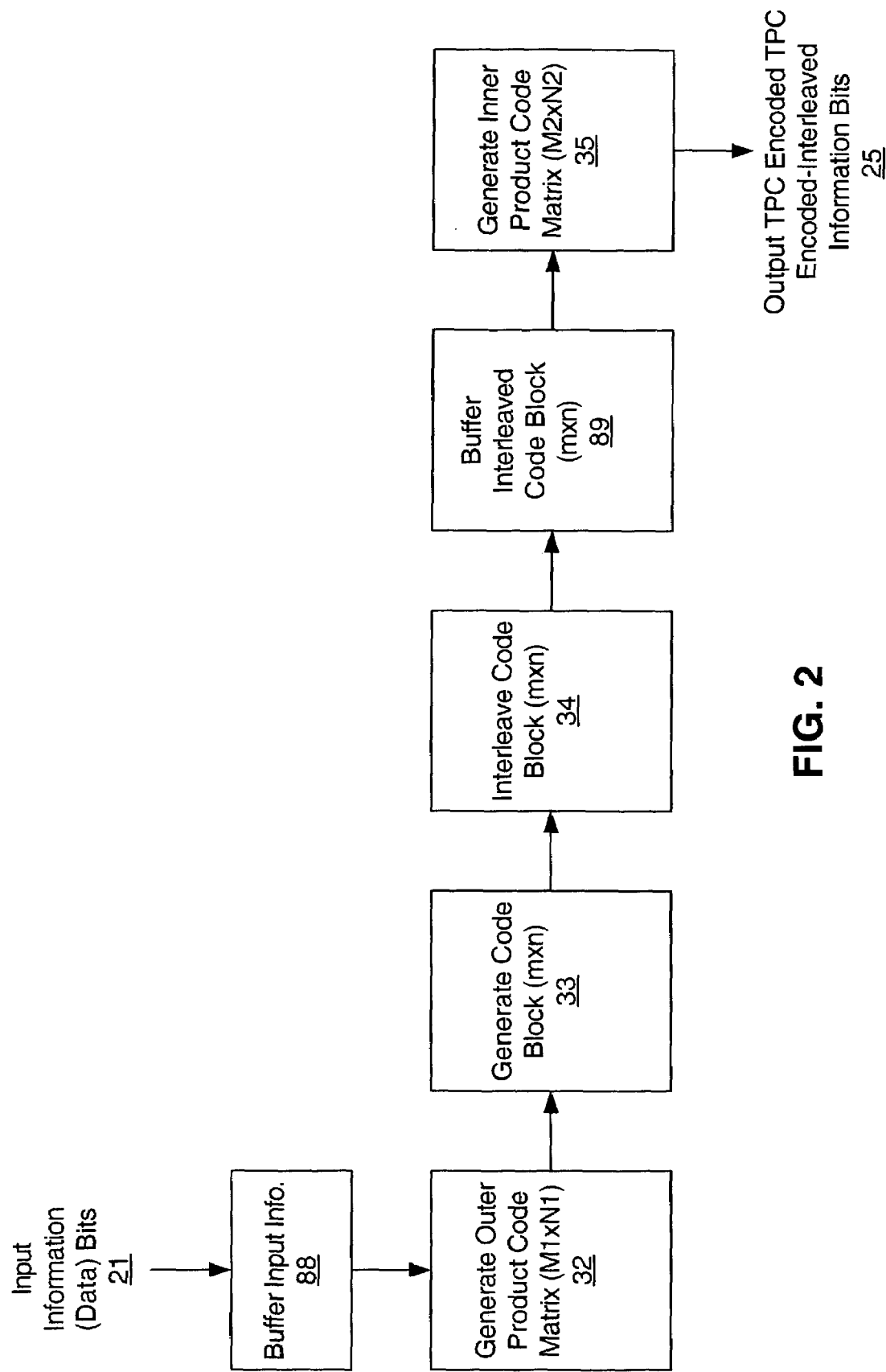
FIG. 2 is an information process block flow diagram in accordance with the encoders of FIGS. 1A, 1B and 1C.

FIG. 2 is an information process block flow diagram in accordance with encoder 100A. With continuing reference to FIG. 2 and renewed reference to FIG. 1A, encoder 100A is further described. Data bits 21 are encoded by outer TPC encoder 11 to generate at 32 a first stage TPC encoder output, such as an outer product code matrix of M1×N1 for M1 and N1 integers greater than zero. Depending on dimensions needed for extended Hamming coding, code shortening, such as by zero padding, of the outer product code matrix may be desired.

Figure 3:
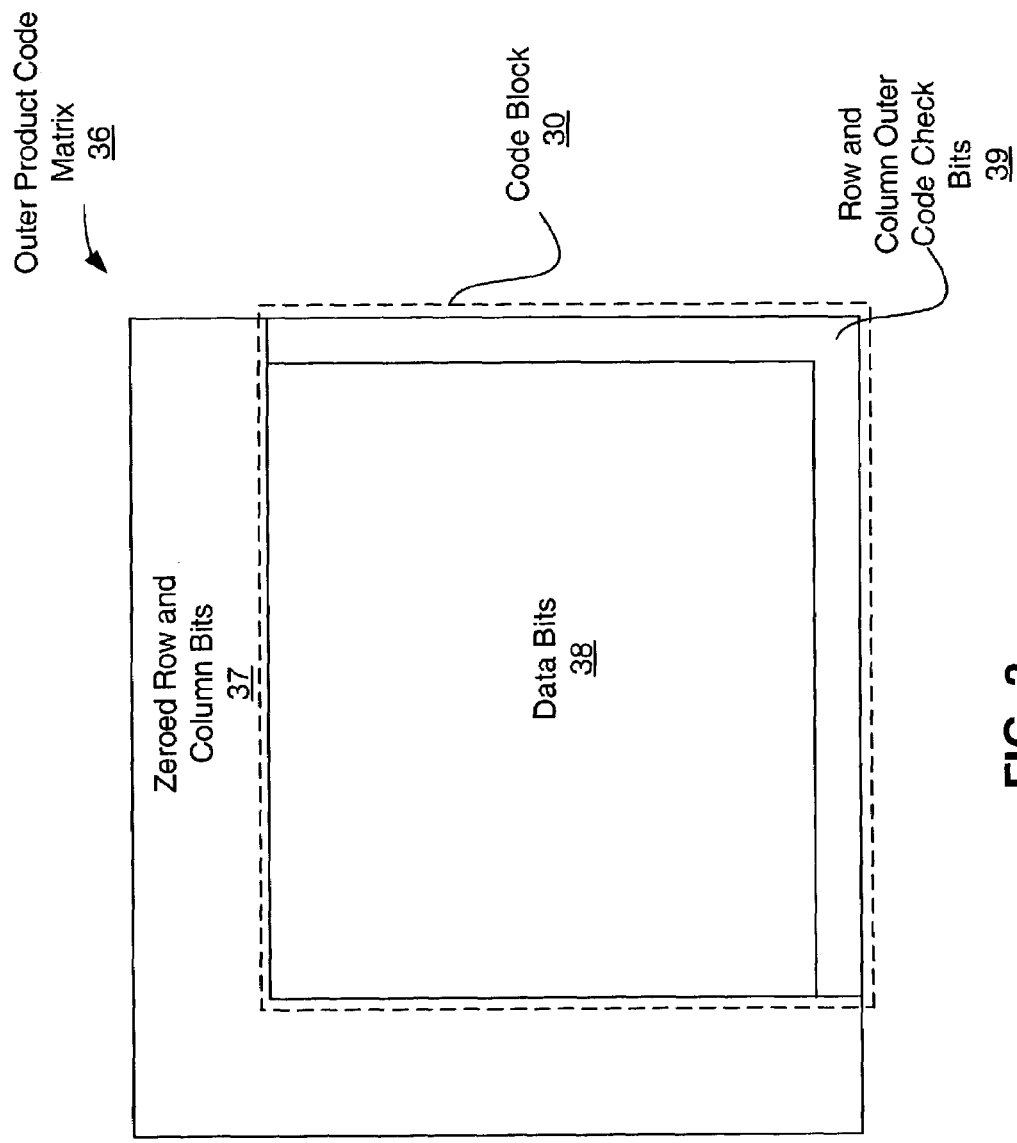
FIG. 3 is a block diagram of an exemplary embodiment of a shortened product code matrix output from a first stage TPC encoder of an encoder of FIGS. 1A, 1B and 1C.

FIG. 3 is a matrix block diagram of an exemplary embodiment of an outer product code matrix 36 generated by outer TPC encoder 11. Outer product code matrix 36 includes zeroed row and column bits 37 and code block 30. Code block 30 includes data bits 38 and outer code check bits 39, where row and column outer code check bits 39 are generated from data bits 38 using TPC. Notably, for purposes of clarity a two-dimensional (2D) TPC matrix is described; however, a three-dimensional (3D) TPC matrix may be used without departing from one or more aspects of the present invention. Furthermore, it should be appreciated that code shortening need not be used, in which embodiment code block 30 generated from outer TPC encoder 11 would form all of outer product code matrix 36. Thus, though the remainder of this description is in terms of code block 30, it should be appreciated that code block 30 may be a full or a shortened outer product code matrix 36.

Figure 4:
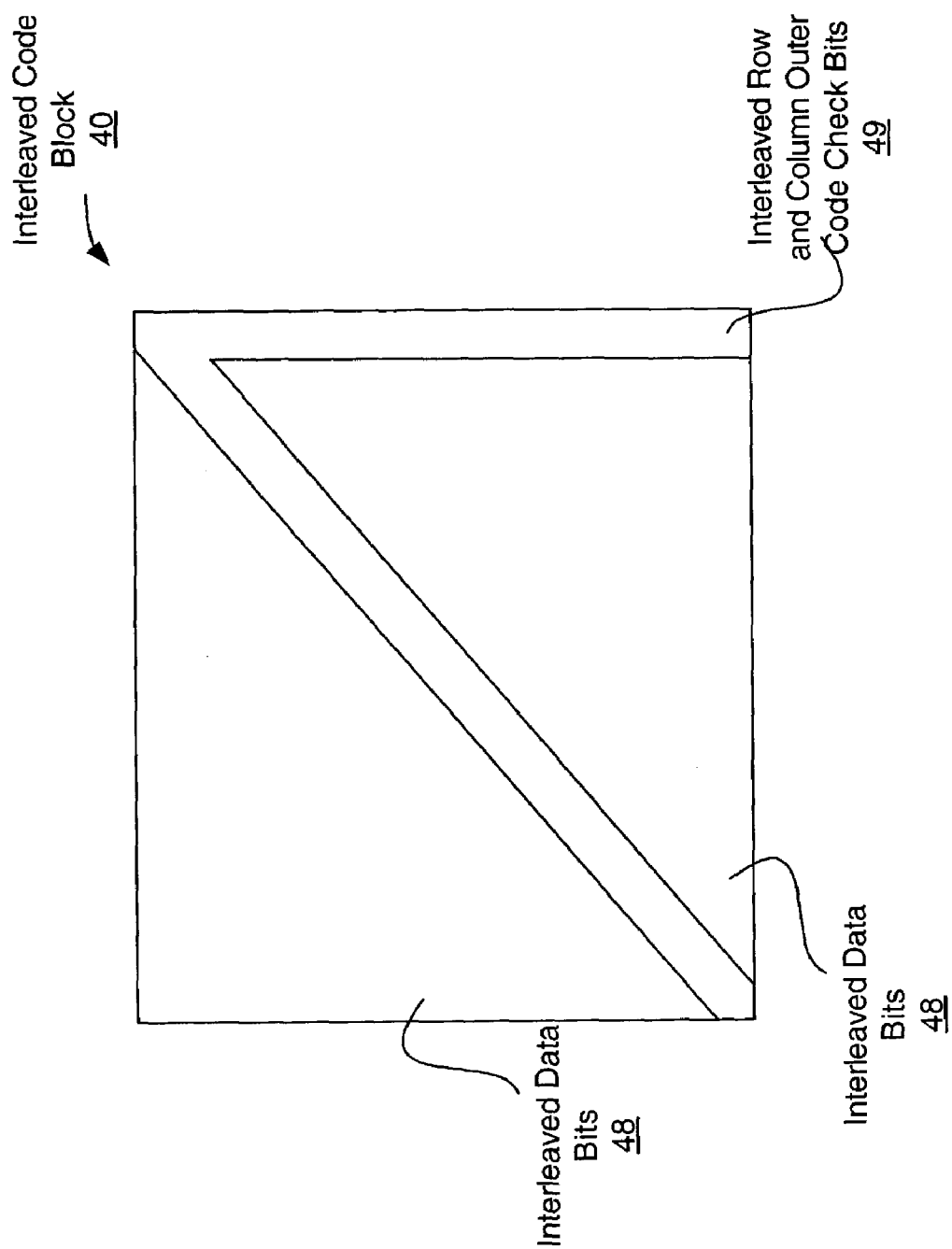
FIG. 4 is a matrix block diagram of an exemplary embodiment of an interleaved code block from an interleaver, such in an encoder of FIGS. 1A, 1B and 1C.

With continuing reference to FIG. 3, and renewed reference to FIGS. 1A and 2, encoder 100A is further described. Outer TPC encoder 11 produces TPC encoded input information bits 23. TPC encoded bits 23 are code block 30 of dimensions m×n for m and n integers, where at least one of integers m and n is less than M1 or N1, respectively, if code shortening is used. If code shortening is not used, m and n may equal M1 and N1, respectively Code block 30 is provided to interleaver 12. Interleaver 12 reads code bits of code block 30 in one order and writes such bits into an information array in a different order. Interleaver 12 may be a helical interleaver or a pseudo-random interleaver, among other known interleavers. For purposes of clarity, a helical interleaver 12 is described, though other known interleaving may be used. Thus, in this serial concatenation of outer TPC encoder 11 and interleaver 12, interleaver 12 responsive to code block 30 produces TPC encoded-interleaved information bits 24, or more succinctly at 34 an m×n interleaved code block is generated, such as an m×n interleaved code block 40 of FIG. 4.

With continuing reference to FIGS. 1A, 2 and 3, FIG. 4 is a matrix block diagram of an exemplary embodiment of an interleaved code block 40 from interleaver 12. Interleaved code block 40 includes interleaved data bits 48 generated from data bits 38, and interleaved row and column outer code check bits 49 generated from row and column outer code check bits 39.

Inner TPC encoder 13 receives interleaved code block 40 and generates therefrom a TPC encoding of TPC encoded-interleaved information, namely, output information bits 25. In other words, at 35 an M2×N2 inner product code matrix is generated, such as an M2×N2 inner product code matrix 50 of FIG. 5 where M2 and N2 are integers greater than zero. Notably, M1 and N1 may, but need not, equal M2 and N2, respectively.

Figure 5:
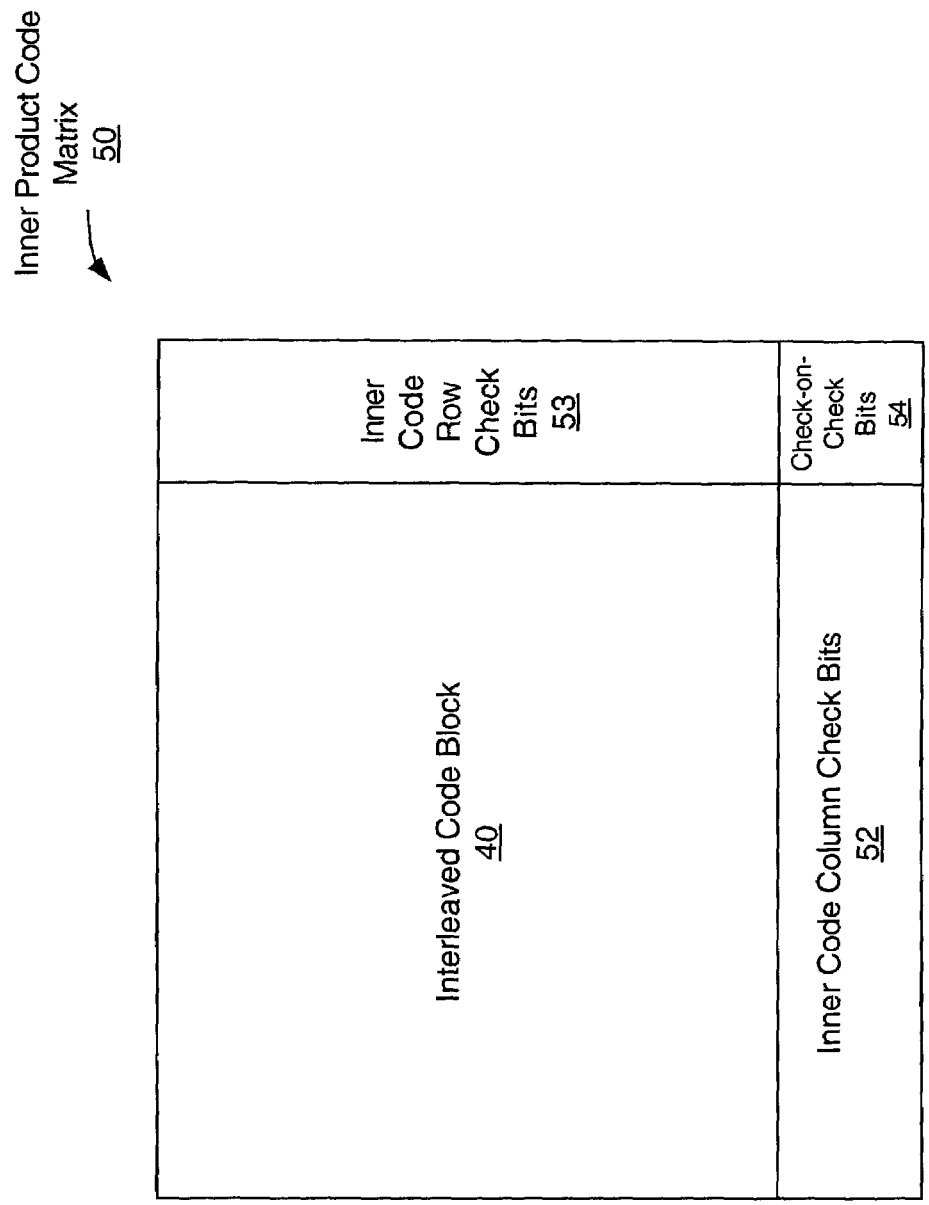
FIG. 5 is a matrix block diagram of an exemplary embodiment of a product code matrix output from a second stage TPC encoder of an encoder of FIGS. 1A, 1B and 1C.

With continuing reference to FIGS. 1A and 2, FIG. 5 is a matrix block diagram of an exemplary embodiment of an inner product code matrix 50 output from inner TPC encoder 13. Inner product code matrix 50 includes interleaved code block 40, inner code row check bits 53, inner code column check bits 52, and optionally check-on-check bits 54. Row check bits 53 and column check bits 52 are generated from interleaved code block bits 40. Check-on-check bits 54 are generated responsive to row check bits 53 and column check bits 52.

To this point in this description, it should be apparent that a serially concatenated interleaved TPC encoder has been described. Because a second stage TPC encoding is done, a more robust encoding with respect to BER is provided over eTPC. As mentioned above, constituent codes for TPC encoding as used herein are typically either parity code or extended Hamming code, but other block codes may also be used.

With renewed reference to FIGS. 1B, 1C and 2, alternative embodiments taking advantage of coding symmetry of TPC encoders is described. Because the encoder may be reconfigurable, a single encoder for inner and outer encoding may be used. This may be used to avoid second TPC encoder circuitry in exchange for less complex buffer circuitry, whether encoders 100B or 100C are formed as part of: a discrete integrated circuit CODEC, a programmable logic device (PLD) core, an application specific integrated circuit (ASIC), an Application Specific Standard Product (ASSP), a Digital Signal Processor (DSP), a system on a chip (SoC), or by programming a PLD, such as a complex PLD (CPLD) or a field programmable gate array (FPGA).

Notably, much of the description for FIGS. 1B and 1C has already been done in FIG. 1A, as indicated by like reference numbering in FIGS. 1B and 1C. Such same description is not repeated here for purposes of clarity.

In FIG. 1B, input 21 to TPC encoder 100B is provided to buffer 14, and interim output 24 of TPC encoder 100B is provided to buffer 14. By "buffer circuitry" or "buffer," is meant any of a variety of known temporary storage devices including memories, buffers, latches, registers, and the like. Buffer 14 provides buffered output 26 to TPC encoder 15 responsive to control signal 81. When TPC encoder 15 is available for encoding, an active control signal 81 is provided from TPC encoder 15 to buffer 14 to indicate such availability.

TPC encoder 15 is both an inner and outer encoder, such as inner and outer TPC encoders 11 and 13 of FIG. 1A. Depending on whether buffered output 26 is either buffered input 21 or buffered interim output 24 as provided to TPC encoder 15, TPC encoder 15 responds by providing either interim output 23 or output 25, respectively.

The exemplary embodiment of encoder 100C in FIG. 1C is similar to the exemplary embodiment of encoder 100B in FIG. 1B, except rather than a single buffer, two buffers, namely input buffer 16 and interim output buffer 18, as well as control signals 82 and 83, are used. Input 21 is buffered by input buffer 16, and buffered output 27 is provide from input buffer 16 to TPC encoder 15 responsive to control signal 82 for generating interim output 23. TPC encoder 15 responds to input from input buffer 16 by generating interim output 23. Interim output 24 from interleaver 12 is provided to interim output buffer 18. Interim output buffer 18 provides such buffered output, namely, buffered output 28 to TPC encoder 15 responsive to control signal 83. TPC encoder 15 responds to input from interim output buffer 18 by generating output 25. Though two control signals 82 and 83 are described, they may be the same signal, such as control signal 81 of FIG. 1B, where buffers 16 and 18 respond in a complementary manner to such a single control signal. In FIG. 2, buffering input 21 and interim output 24 is respectively shown at 88 and 89 that applies to both of encoders 100B and 100C.

Figure 6A:
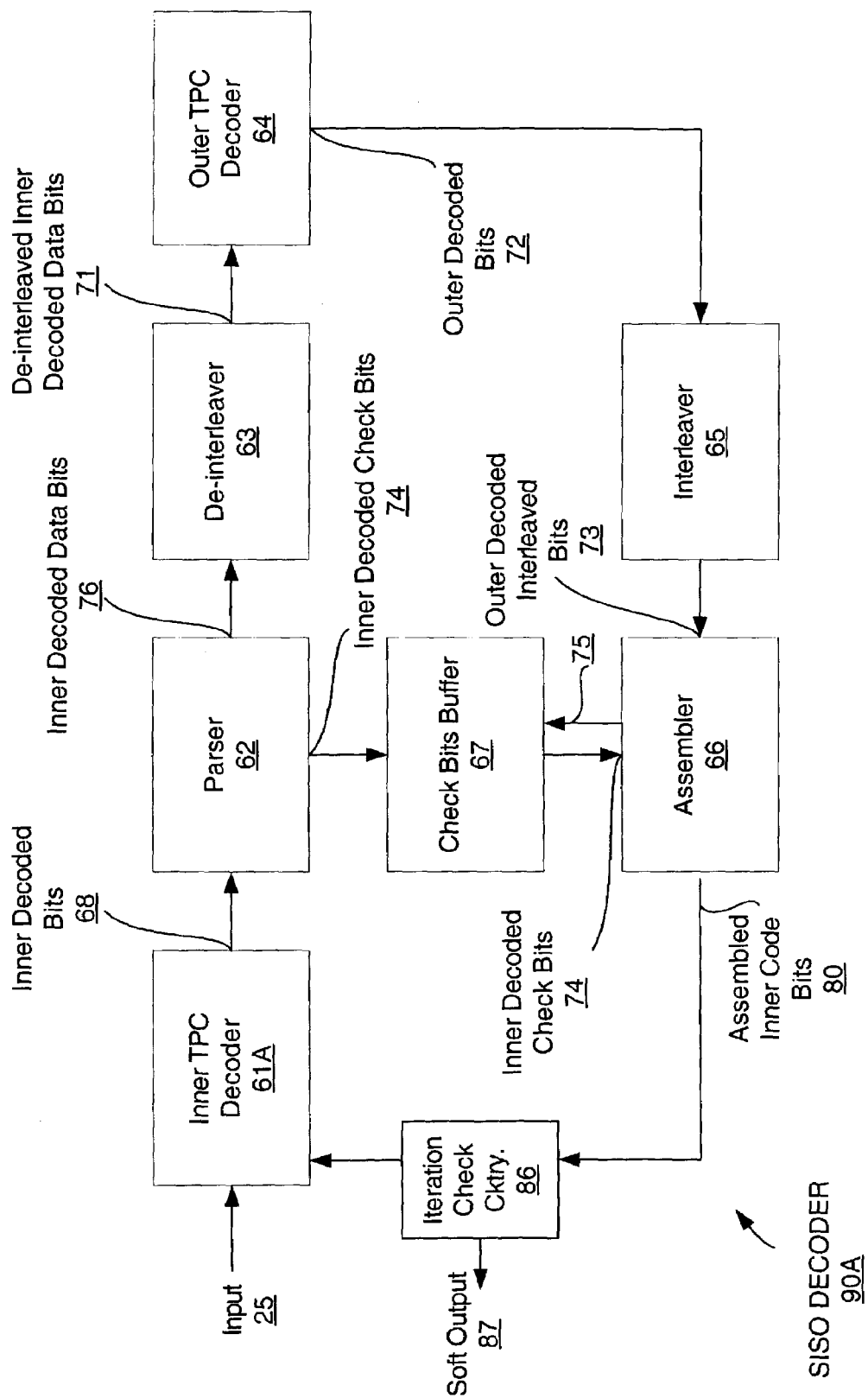
FIGS. 6A and 6B are high level block diagrams of exemplary embodiments of concatenated interleaved TPC SISO decoders in accordance with one or more aspects of the present invention.

FIG. 6A is a high level block diagram of an exemplary embodiment of a concatenated interleaved TPC soft-input, soft-output (SISO) decoder 90A in accordance with one or more aspects of the present invention. Output 25 from an encoder as described above with respect to FIGS. 1A, 1B and 1C, is coupled as input 25 to SISO decoder 90A through a communications channel. Soft input 25 is received by inner TPC decoder 61A. Inner TPC decoder 61A generates inner decoded (soft) bits 68 by doing a single full iteration of decoding. Thus, it should be appreciated that a single iteration of decoding by inner TPC decoder 61 is used to obtain sufficient convergence. However, more than one full iteration of decoding may be used by TPC decoder 61A.

Inner TPC decoder 61A has a complementary constituent decoding algorithm to that used in the inner encoder of FIGS. 1A, 1B and 1C. Likewise, outer TPC decoder 64 has a complementary constituent decoding algorithm to that used in the outer encoder of FIGS. 1A, 1B and 1C. For example, if inner encoder 13 is configured to encode with an extended Hamming code, then inner decoder 61A is configured to decode with an extended Hamming code. As another example, if outer encoder 11 is configured to encode with a parity code, then outer decoder 64 is configured to decode with a parity code. Thus, inner encoder and inner decoder are inversely related with respect to the code function employed. Likewise, outer encoder and outer decoder are inversely related with respect to the code function employed.

Figure 6B:
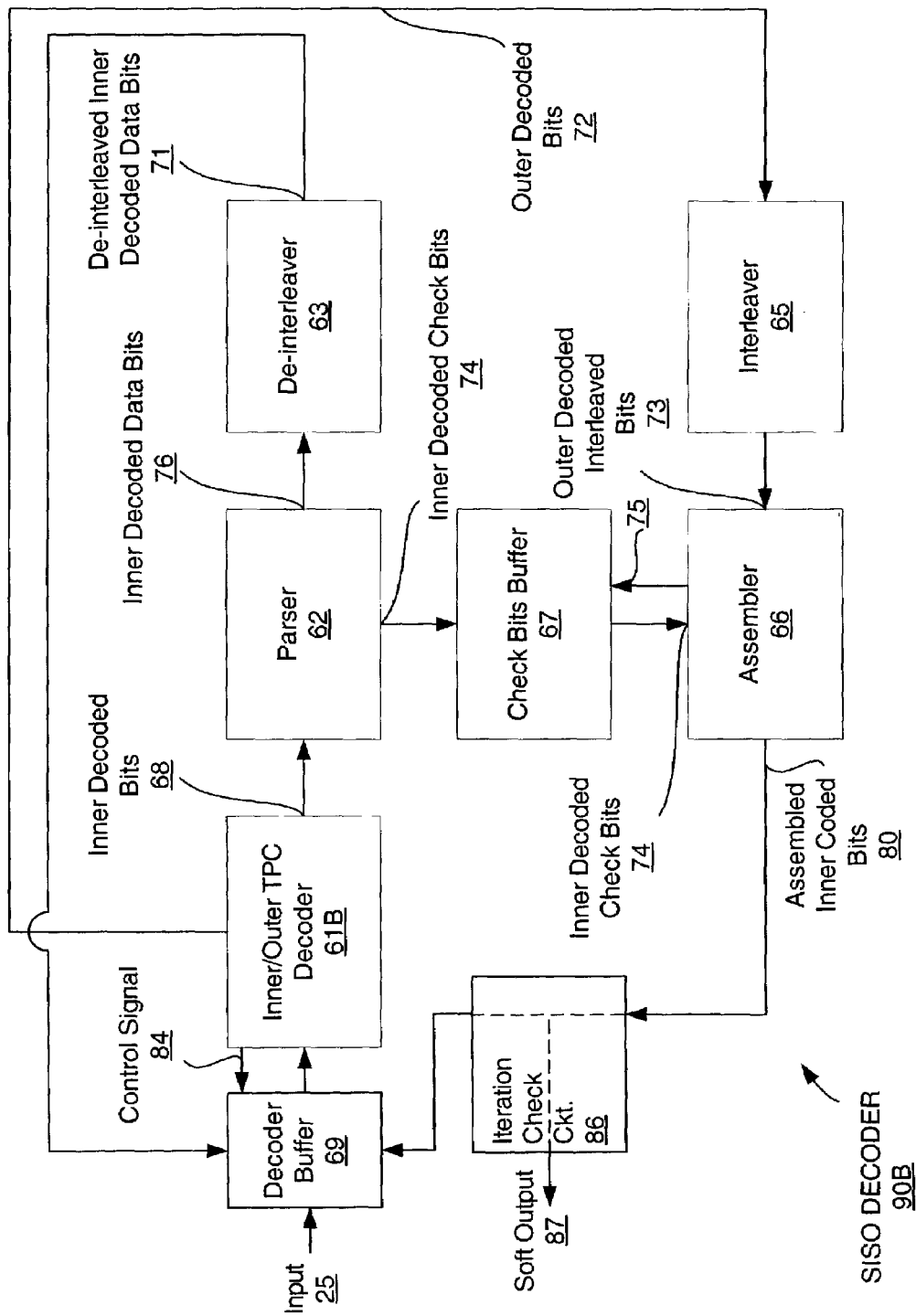

FIG. 6B is a high level block diagram of an exemplary embodiment of a concatenated interleaved TPC SISO decoder 90B in accordance with one or more aspects of the present invention. Decoder buffer 69 is used to eliminate outer TPC decoder 64. Thus, input 25 is provided to decoder buffer 69 prior to being provided to (inner/outer) TPC decoder 61B. Decoder buffer 69 is coupled to receive output from de-interleaver 63 prior to providing to TPC decoder 61B and to iteration check circuitry 86 to receive assembled inner code bits 80, described below in additional detail. Decoder buffer 69 may be partitioned to store all of input 25, de-interleaved inner decoded date bits 71 output from de-interleaver 63 and assembled inner code bits 80. Furthermore, decoder buffer 69 and check bits buffer 67 may be the same device with partitioning for inner decoded check bits 74.

Responsive to whether TPC decoder 61B receives input 25/output 80 or output 71 from buffer 69, TPC decoder 61B respectively provides output 68 to parser 62 or output 72 to interleaver 65. Control signal 84 is provide from TPC decoder 61B to decoder buffer 69 to indicate availability of TPC decoder 61B to decode. Thus, additional complex circuitry associated with outer TPC decoder 64 may be avoided in favor of decoder buffer 69. For purposes of clarity, SISO decoder 90B is described further with description of SISO decoder 90A.

Figure 7:
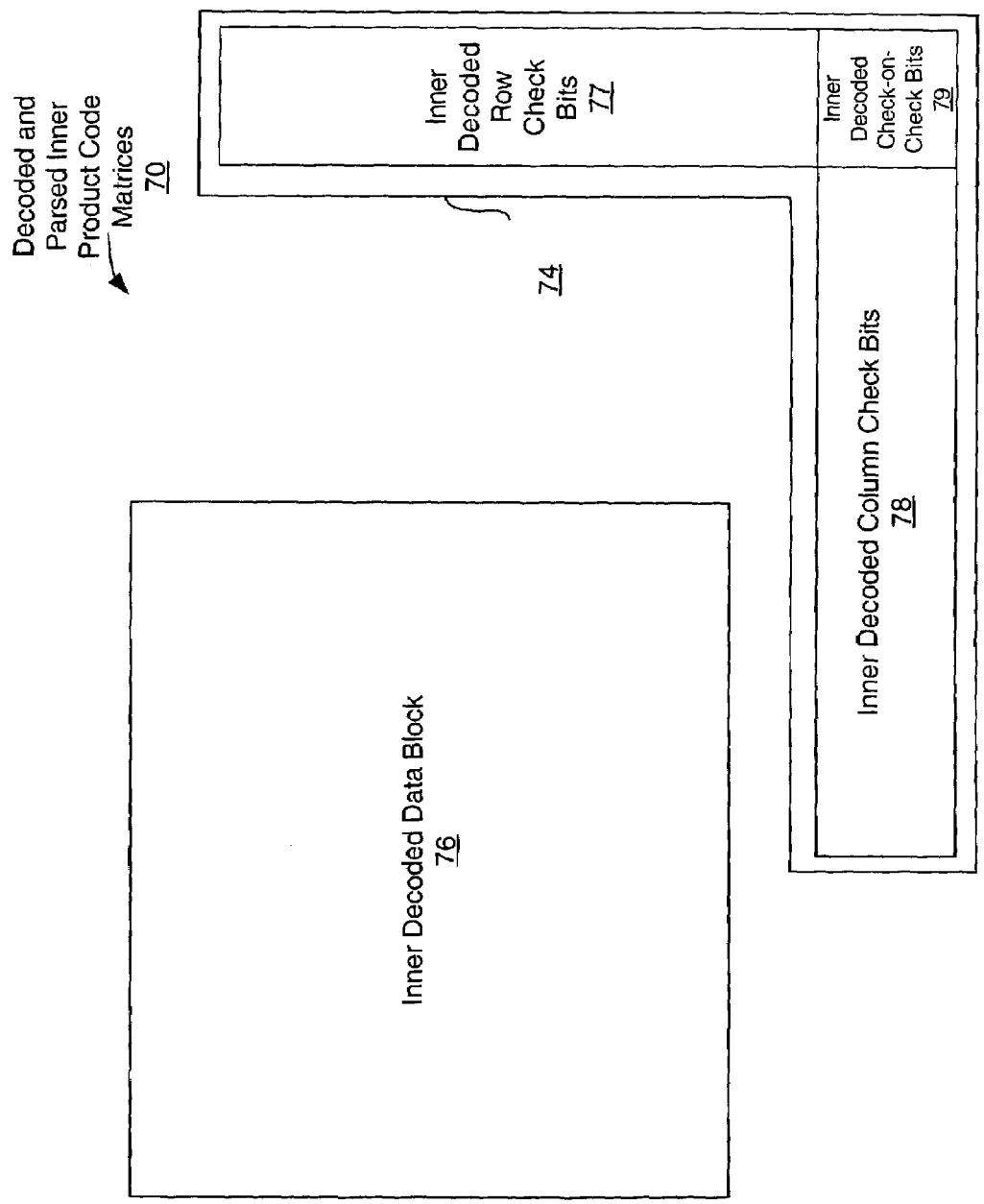
FIG. 7 is a matrix block diagram of an exemplary embodiment of an inner decoded and parsed product code matrix in accordance with one or more aspects of the present invention.

Referring again to FIG. 6A, inner decoded (soft) bits 68 are provided to parser 62. Parser 62 separates check bits and data bits of inner decoded (soft) bits 68. FIG. 7 is a matrix block diagram of an exemplary embodiment of a partially decoded and parsed inner product code matrices 70 in accordance with one or more aspects of the present invention. Parsed inner product code matrices 70 includes inner decoded data code block 76 separated from inner decoded check bits 74. Inner decoded check bits 74 include inner decoded row check bits 77, inner decoded column check bits 78, and optionally inner decoded check-on-check bits 79.

With continuing reference to FIG. 6A, parser 62 provides inner decoded data bits 76 to de-interleaver 63 and provides inner decoded check bits 74 to assembler 66. Optionally, a check bits buffer 67 may be used to receive inner decoded check bit 74 and buffer them prior to providing to assembler 66.

De-interleaver 63 is configured to perform an inverse function of interleaver 12 of FIGS. 1A, 1B and 1C. This inverse function depends on whether a helical, pseudo random or other known interleaving is used in encoding. De-interleaved inner decoded data bits 71 are output to outer TPC decoder 64. Again, it should be appreciated that input to and output from decoders 61A and 64 is soft information.

Outer TPC decoded (soft) bits 72 are generated by a single full iteration of decoding by outer TPC decoder 64 or TPC decoder 61B. Thus, it should be appreciated that a single iteration of decoding by TPC decoder 64 or 61B, as applicable, is used to obtain sufficient convergence. However, more than one full iteration of decoding by TPC decoder 64 or 61B may be used. Outer decoded bits 72 are provided to interleaver 65.

Interleaver 65 has a same function as interleaver 12 of FIGS. 1A, 1B and 1C, such as helical, pseudo random or other known interleaving. Outer decoded-interleaved bits 73 are provided from interleaver 65 to assembler 66. Assembler or concatenator 66 assembles outer decoded interleaved bits 73 with inner decoded check bits 74 to provide assembled inner code bits 80, which is a soft output. Assembler 66 provides control signal 75 to indicate to check bits buffer 67 that stored inner decoded check bits 74 are to be provided for concatenation with outer decoded-interleaved bits.

Figure 8:
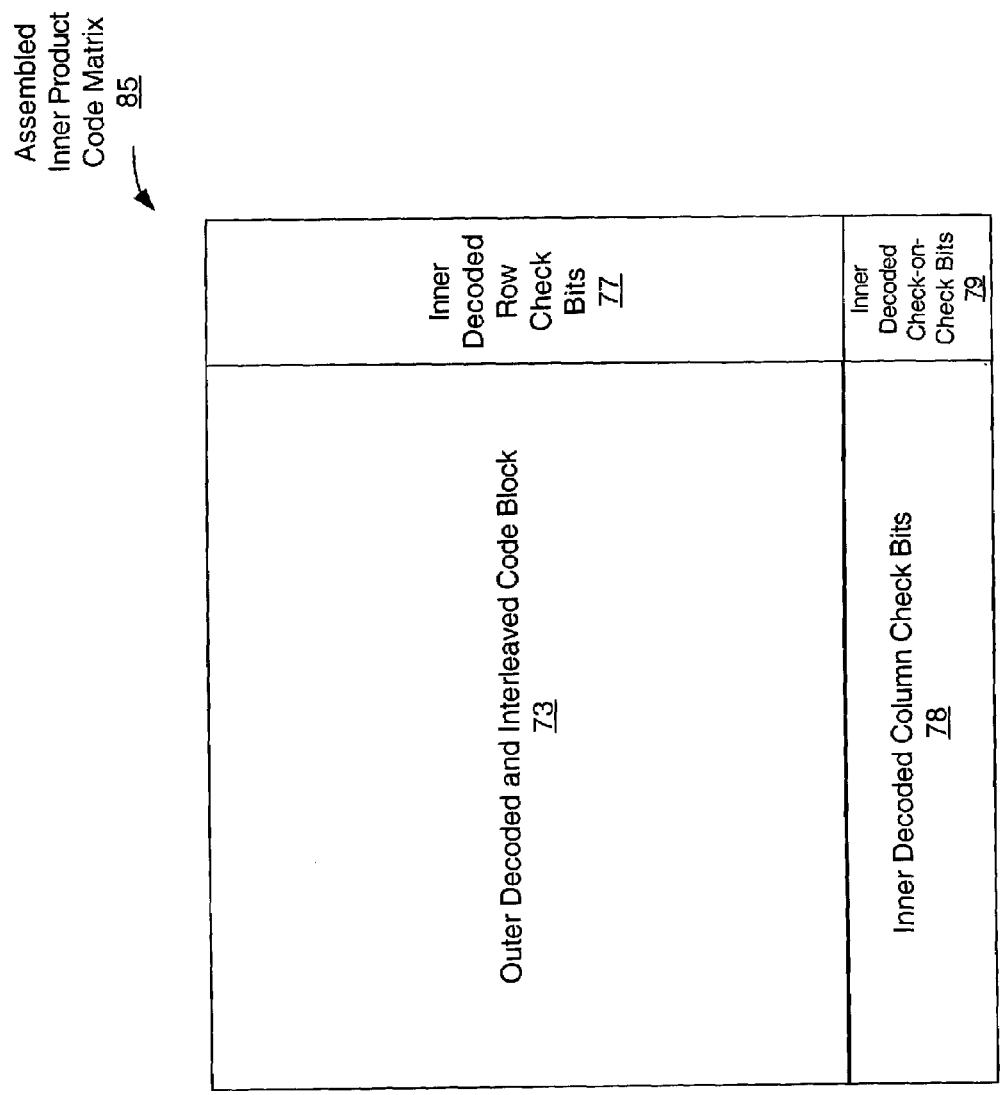
FIG. 8 is a matrix block diagram of an exemplary embodiment of an assembled inner product code matrix in accordance with one or more aspects of the present invention.

FIG. 8 is a matrix block diagram of an exemplary embodiment of an assembled inner product code matrix 85 in accordance with one or more aspects of the present invention. Assembled inner product code matrix 85 includes outer decoded and interleaved code block 73 and inner decoded check bits 74 shown in FIG. 7, of which inner decoded check-on-check bits 79 are optional as mentioned above. Assembled inner product code matrix 85 is a form of assembled inner code bits 80 of FIGS. 6A and 6B.

Referring again to FIG. 6A, decoding as described with respect to SISO decoder 90A may be done with more than one cycle. A fixed number of cycles may be used. Alternatively, a threshold percentage difference or other stopping criterion may be used between a prior output of assembled inner code bits 80 stored and a current output of assembled inner code bits 80. An iteration check circuit 86 is coupled to receive assembled inner code bits 80 and either provide it as soft output 87 or provide it to inner TPC decoder 61 for another decoding cycle based on either or both iteration count or convergence or a combination thereof. Thus, iteration check circuitry 86 may include one or more of a counter, a buffer and a comparator, among other known circuitry depending on implementation.

Figure 9:
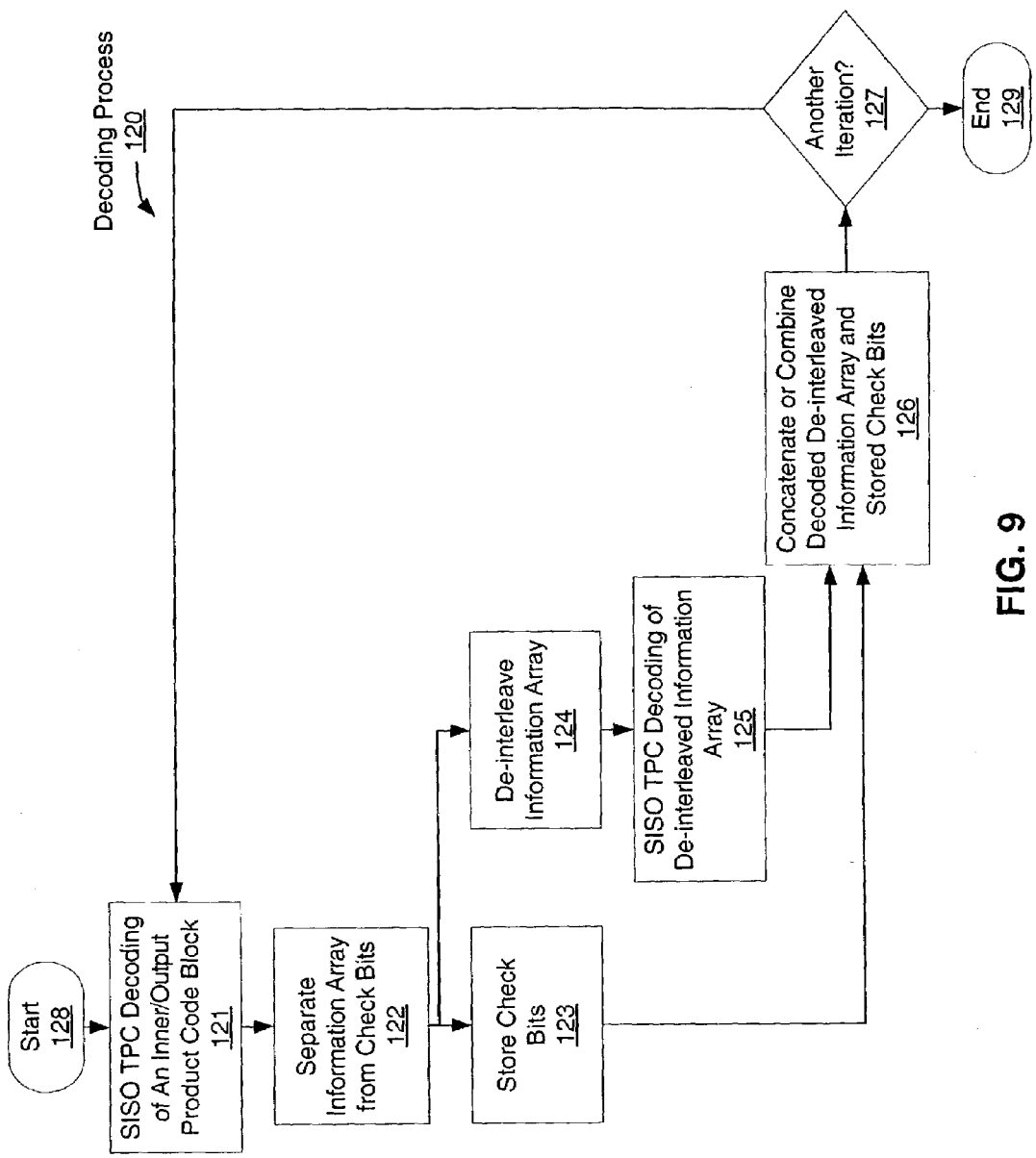
FIG. 9 is a flow diagram of an exemplary embodiment of a decoding process in accordance with one or more aspects of the present invention.

FIG. 9 is a flow diagram of an exemplary embodiment of a decoding process 120 in accordance with one or more aspects of the present invention. Though decoding was described above with respect to hardware implementations, it should be appreciated that decoding as described herein may be done in software or hardware or a combination thereof. Decoding process 120 is initiated at 128. At 121, SISO TPC decoding of an inner product code block is done, such as inner product code matrix 50 of FIG. 5. At 122, an information array is separated from check bits of the decoded inner product code block. At 123, the separated out check bits are stored. At 124, the separated out information array is de-interleaved. At 125, SISO TPC decoding of the de-interleaved information array from 124 is done. At 126, the decoded-de-interleaved information array from 125 is concatenated or combined with the stored check bits from 123 to provide an assembled inner product code matrix output, such as matrix 85 of FIG. 8. At 127, a decision as to whether to do another decoding iteration is made. This may be based on total number of iterations, convergence or some other stopping criteria or a combination thereof. If another iteration is to be done, the assembled inner product code matrix output of 126 is decoded at 121 and decoding process 120 continues from there as previously described. If, however, no other iteration is to be done, decoding process 120 ends at 129.

Figure 10:
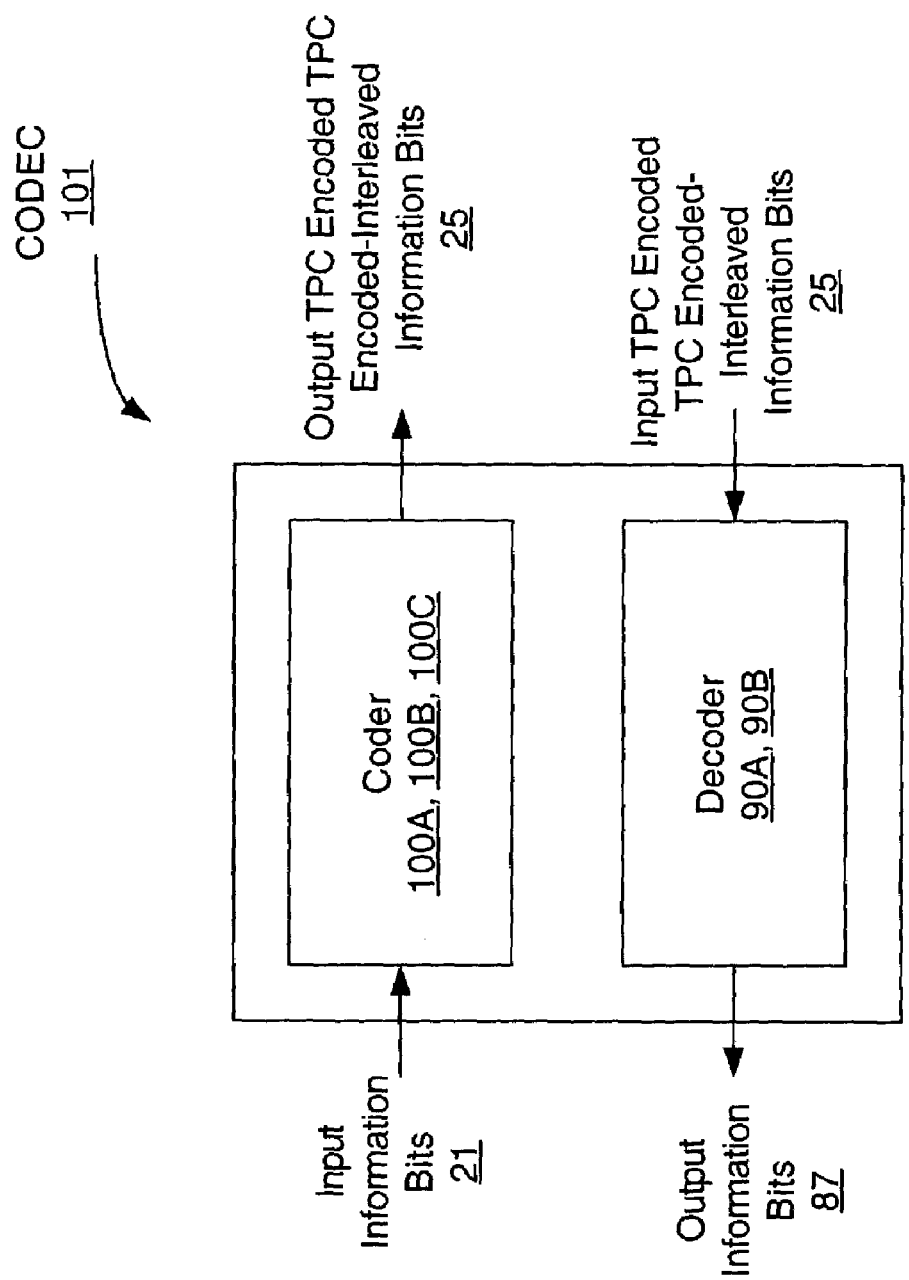
FIG. 10 is a high level block diagram of an exemplary embodiment of a TPC encoder-decoder (CODEC) in accordance with one or more aspects of the present invention.

FIG. 10 is a high level block diagram of an exemplary embodiment of an encoder-decoder (CODEC) 101 in accordance with one or more aspects of the present invention. CODEC 101 comprises at least one encoder or coder 100A, 100B or 100C and at least one decoder 90A or 90B. CODEC 101 may be formed as a discrete integrated circuit CODEC, or as part of a PLD core, an ASIC, as an ASSP, a DSP, an SoC, or by programming a PLD.

Figure 11:
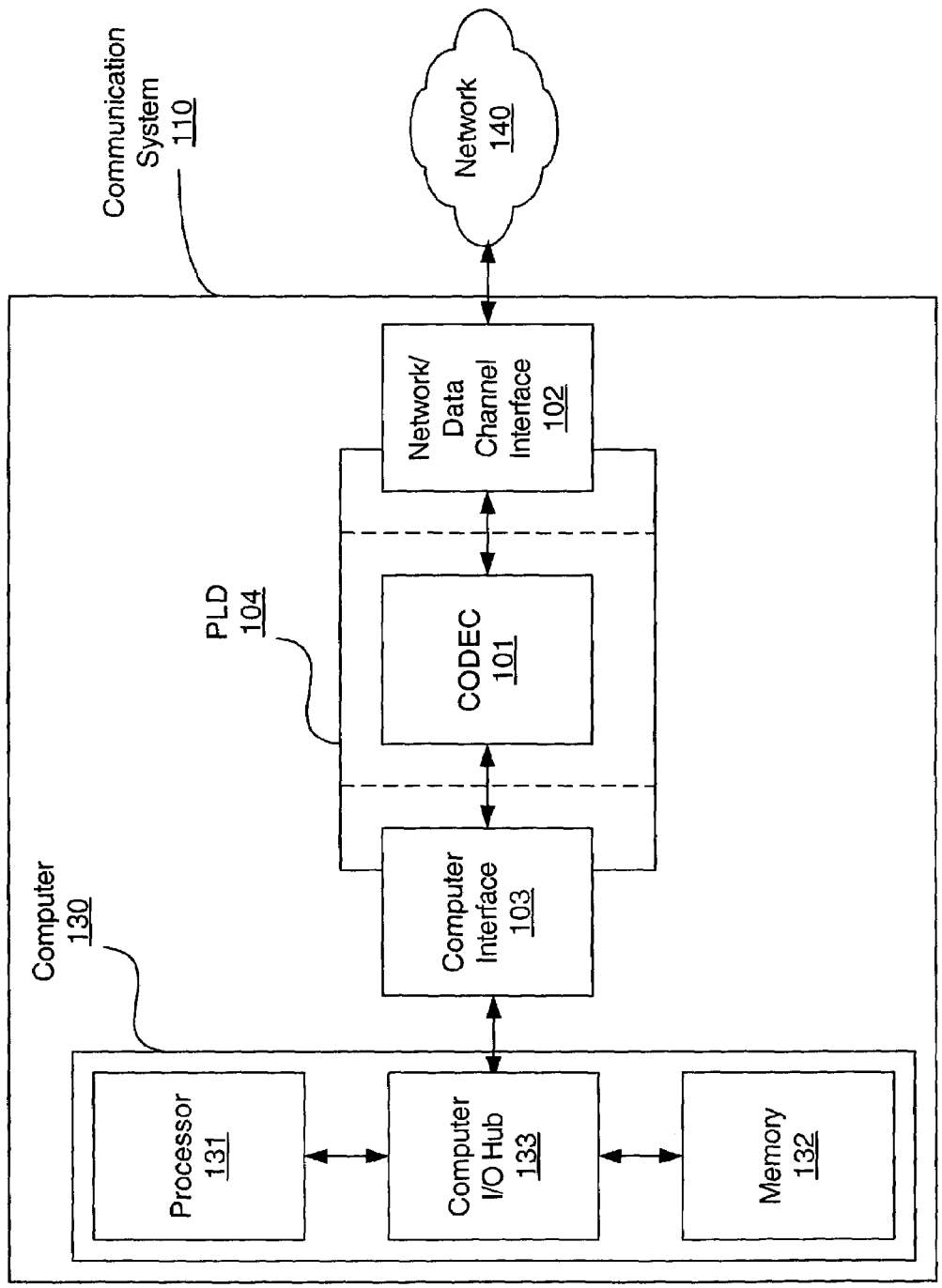
FIG. 11 is a high level block diagram of an exemplary embodiment of a communication subsystem having the CODEC of FIG. 10.

FIG. 11 is a high level block diagram of an exemplary embodiment of a communication subsystem 110 having the CODEC of FIG. 10. Communication subsystem 110 includes computer interface 103, computer 130, CODEC 101 and network/data channel interface 102. Network/data channel interface 102 may be coupled to a network 140, and computer interface 103 may be coupled to a computer (not shown). All or some portion of either or both of computer interface 103 and network/data channel interface 102 may be part of a core of PLD 104 or programmed into PLD 104 or a combination of both. CODEC 101 may be programmed into PLD 104, part of a core of PLD 104 or a combination of both. Thus, CODEC 101 may be used for communicating information between a computer and a network via a data channel.

Computer 130 comprises processor 131, input/output hub 133 and system memory 132. Processor 131 and memory 132 are coupled to computer input/output hub 133. Computer interface 103 is coupled to computer input/output hub 133.

Accordingly, it should be appreciated that TPC concatenated-interleaved encoding and decoding have been described. It should further be appreciated that soft information allows for more decibels, namely, more code gain, as compared with hard information. Moreover, off-the-shelf TPC cores may be used for inner and outer TPC encoders and decoders, so no special circuitry is needed, or licensable TPC cores may be modified for providing control signals, as described above. Furthermore, known extended Hamming codes and parity codes for 2D or 3D may be used. Additionally, there is a wide range of known block sizes and code rates for product codes which may be used.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. For example, although turbo product coding based on either simple parity or extended Hamming constituent codes is described, turbo product coding based on other block codes, such as BCH codes, may also be used. Claim(s) listing steps do not imply any order of the steps.

What is claimed is:

1. An encoder for concatenated-interleaved turbo product code encoding, comprising:
at least one buffer, the at least one buffer disposed to receive input information;
a turbo product code encoder coupled to the at least one buffer to receive buffered input information and configured to generate a first encoded output responsive to the buffered input information;

an interleaver coupled to the turbo product code encoder to receive the first encoded output therefrom and coupled to the at least one buffer to provide interleaved output thereto; and the turbo product code encoder coupled to the at least one buffer to receive buffered interleaved output and configured to generate second encoded output responsive to the buffered interleaved output.

2. The encoder according to claim 1, wherein the first encoded output is generated using either parity coding or extended Hamming coding.

3. The encoder according to claim 1, wherein the second encoded output is generated using either parity coding or extended Hamming coding.

4. A method of decoding, comprising:
first turbo product code decoding of a turbo product code block input to provide a first decoded code block, the first decoded code block having data bits and check bits;
separating the first decoded code block into the data bits and the check bits;
de-interleaving the data bits to provide de-interleaved data bits;
second turbo product code decoding of the de-interleaved data bits to provide a second decoded code block; and
combining the second decoded code block and the check bits stored to provide an assembled inner code block.

5. The method according to claim 4, further comprising determining whether to do another iteration of the decoding using the second decoded code block as the turbo product code block input in the first turbo product decoding.

6. A decoder for concatenated-interleaved turbo product code decoding, comprising:
a first stage turbo product code decoder;
a parser coupled to the first stage turbo product code decoder and configured to parse first stage turbo product code decoder output into data bits and check bits;
a storage device coupled to receive and configured to store the check bits;
a de-interleaver coupled to receive and configured to de-interleave the data bits;
a second stage turbo product code decoder coupled to receive and to decode the data bits de-interleaved;
an interleaver coupled to the second stage turbo product code decoder and configured to interleave second stage turbo product code decoder output into interleaved data bits; and
an assembler coupled to receive the interleaved data bits and the check bits stored and configured to concatenate the interleaved data bits and the check bits.

7. The decoder according to claim 6, further comprising an iteration check circuit coupled to the assembler and configured to either allow the interleaved data bits and the check bits concatenated to be provided as an output matrix or as input to the first stage turbo product code decoder.

8. A decoder for concatenated-interleaved turbo product code decoding, comprising:
a first storage device configure to receive input information;
a turbo product code decoder coupled to the first storage device and configure to obtain and decode the input information stored;
a parser coupled to the first stage turbo product code decoder and configured to parse first stage turbo product code decoder output into data bits and check bits;
a second storage device coupled to receive and configured to store the check bits;

a de-interleaver coupled to receive and configured to de-interleave the data bits;
the first storage device coupled to receive the data bits de-interleaved;
the turbo product code decoder coupled to the first storage device and configured to obtain and decode the data bits de-interleaved;
an interleaver coupled to the turbo product code decoder to receive the data bits de-interleaved and decoded and configure to provide interleaved data bits therefrom; and
an assembler coupled to receive the interleaved data bits and the check bits stored and configured to concatenate the interleaved data bits and the check bits.

9. The decoder according to claim 8, further comprising an iteration check circuit coupled to the assembler and configured to either allow the interleaved data bits and the check bits concatenated to be provided as an output matrix or as input to the turbo product code decoder.

10. A coder/decoder (CODEC), comprising:
an encoder for concatenated-interleaved turbo product code encoding including:
a first stage turbo product code encoder;
a first interleaver coupled to receive output from the first stage turbo product code encoder;
a second stage turbo product code encoder coupled to receive output from the first interleaver;
a decoder for concatenated-interleaved turbo product code decoding including:
a first stage turbo product code decoder;
a parser coupled to the first stage turbo product code decoder and configured to parse first stage turbo product code decoder output into data bits and check bits;
a storage device coupled to receive and configured to store the check bits;
a de-interleaver coupled to receive and configured to de-interleave the data bits;
a second stage turbo product code decoder coupled to receive and to decode the data bits de-interleaved;
a second interleaver coupled to the second stage turbo product code decoder and configured to interleave second stage turbo product code decoder output into interleaved data bits; and
an assembler coupled to receive the interleaved data bits and the check bits stored and configured to concatenate the interleaved data bits and the check bits.

11. The CODEC according to claim 10, wherein the encoder and the decoder are programmed into a programmable logic device.

12. The CODEC according to claim 10, wherein the encoder and the decoder are part of a programmable logic device core.

13. The CODEC according to claim 10, wherein the encoder and the decoder are coupled to a computer interface.

14. The CODEC according to claim 10, wherein the encoder and the decoder are coupled to a data channel interface.

15. A system for communicating information, comprising:
a computer; and
an encoder/decoder coupled to the computer;
the encoder configured for concatenated-interleaved turbo product code encoding including:
a first stage turbo product code encoder;
a first interleaver coupled to receive output from the first stage turbo product code encoder;
a second stage turbo product code encoder coupled to receive output from the first interleaver;

the decoder configured for concatenated-interleaved turbo product code decoding including:
  a first stage turbo product code decoder;
  a parser coupled to the first stage turbo product code decoder and configured to parse first stage turbo product code decoder output into data bits and check bits;
  a storage device coupled to receive and configured to store the check bits;
  a de-interleaver coupled to receive and configured to de-interleave the data bits;
  a second stage turbo product code decoder coupled to receive and to decode the data bits de-interleaved;
  a second interleaver coupled to the second stage turbo product code decoder and configured to interleave second stage turbo product code decoder output into interleaved data bits; and
  an assembler coupled to receive the interleaved data bits and the check bits stored and configured to concatenate the interleaved data bits and the check bits.

16. A system for communicating information, comprising:
a computer; and
an encoder/decoder coupled to the computer, the encoder/decoder configured for concatenated-interleaved turbo product code encoding including:
  a turbo product code encoder;
  a first interleaver coupled to receive output from the turbo product code encoder; and
  the turbo product code encoder coupled to receive output from the first interleaver;
the encoder/decoder configured for concatenated-interleaved turbo product code decoding further including:
  a turbo product code decoder;
  a parser coupled to the turbo product code decoder and configured to parse first turbo product code decoder output into data bits and check bits;
  a storage device coupled to receive and configured to store the check bits;
  a de-interleaver coupled to receive and configured to de-interleave the data bits;
  the turbo product code decoder coupled to receive and to decode the data bits de-interleaved;
  a second interleaver coupled to the turbo product code decoder and configured to interleave second turbo product code decoder output into interleaved data bits; and
  an assembler coupled to receive the interleaved data bits and the check bits stored and configured to concatenate the interleaved data bits and the check bits.

17. The system according to claim 16, wherein the turbo product code decoder comprises:
  a first stage turbo product code decoder; and
  a second stage turbo product code decoder coupled to receive and to decode the data bits de-interleaved;
  wherein the parser is coupled to the first stage turbo product code decoder and is configured to parse first stage turbo product code decoder output into the data bits and the check bits; and
  wherein the second interleaver is coupled to the second stage turbo product code decoder and is configured to interleave second stage turbo product code decoder output into the interleaved data bits.

18. The system according to claim 17, wherein the turbo product code encoder comprises:
  a first stage turbo product code encoder; and
  a second stage turbo product code encoder coupled to receive the output from the first interleaver;
  wherein the first interleaver is coupled to receive output from the first stage turbo product code encoder.

19. The system according to claim 16, wherein the turbo product code encoder comprises:
  a first stage turbo product code encoder; and
  a second stage turbo product code encoder coupled to receive the output from the first interleaver;
  wherein the first interleaver is coupled to receive output from the first stage turbo product code encoder.

20. The system according to claim 19, wherein the turbo product code decoder comprises:
  a first stage turbo product code decoder; and
  a second stage turbo product code decoder coupled to receive and to decode the data bits de-interleaved;
  wherein the parser is coupled to the first stage turbo product code decoder and is configured to parse first stage turbo product code decoder output into the data bits and the check bits; and
  wherein the second interleaver is coupled to the second stage turbo product code decoder and is configured to interleave second stage turbo product code decoder output into the interleaved data bits.

* * * * *